(12) United States Patent
Wang et al.

(10) Patent No.: US 11,906,603 B2
(45) Date of Patent: Feb. 20, 2024

(54) SYSTEM AND METHOD FOR MEASURING MAGNETOREFRACTIVE EFFECT OF OPTICAL FIBER

(71) Applicant: Shanghai University, Shanghai (CN)

(72) Inventors: Tingyun Wang, Shanghai (CN); Yi Huang, Shanghai (CN); Chuanlu Deng, Shanghai (CN); Chengyong Hu, Shanghai (CN)

(73) Assignee: Shanghai University, Shanghai (CN)

( * ) Notice: Subject to any disclaimer, the term of this patent is extended or adjusted under 35 U.S.C. 154(b) by 0 days.

(21) Appl. No.: 17/834,201

(22) Filed: Jun. 7, 2022

(65) Prior Publication Data

US 2022/0390530 A1 Dec. 8, 2022

(30) Foreign Application Priority Data

Jun. 8, 2021 (CN) .............................. 202110635314

(51) Int. Cl.
*G01D 5/353* (2006.01)
*G01R 33/032* (2006.01)

(52) U.S. Cl.
CPC ....... *G01R 33/032* (2013.01); *G01D 5/35329* (2013.01)

(58) Field of Classification Search
CPC .............. G01R 33/032; G01R 33/0023; G01D 5/35329; G01D 5/353; G01D 5/35303; G01D 5/35306
See application file for complete search history.

(56) References Cited

U.S. PATENT DOCUMENTS

| 4,147,979 | A | * | 4/1979 | Baues | G01R 29/12 |
| | | | | | 385/12 |
| 4,376,248 | A | * | 3/1983 | Giallorenzi | G01R 33/0327 |
| | | | | | 324/96 |
| 4,899,042 | A | * | 2/1990 | Falk | G01D 5/35303 |
| | | | | | 359/276 |
| 4,929,050 | A | * | 5/1990 | Wilson | G01D 5/35303 |
| | | | | | 250/231.19 |
| 4,979,798 | A | * | 12/1990 | Lagakos | G01H 9/004 |
| | | | | | 385/12 |
| 5,430,814 | A | * | 7/1995 | McCall | G01K 11/3206 |
| | | | | | 250/227.27 |
| 2003/0095263 | A1 | * | 5/2003 | Varshneya | A61B 5/4818 |
| | | | | | 356/477 |

* cited by examiner

*Primary Examiner* — Jonathan M Hansen
(74) *Attorney, Agent, or Firm* — Bauer Law Offices; Robert M. Bauer (57) ABSTRACT

Disclosed are a system and a method for measuring a magnetorefractive effect of an optical fiber. The system comprises a laser, a coupler A, a sensing optical fiber, a reference optical fiber, a carrier generator, a coupler B, a photoelectric detector and a data acquisition and processing module. The coupler A, the sensing optical fiber, the reference optical fiber and the coupler B form a Mach-Zehnder optical fiber interferometer. An external magnetic field influences the refractive index of the sensing optical fiber, so that the optical path difference between two paths of optical signals in the sensing optical fiber and the reference optical fiber is changed, the intensity of an interference optical signal output by the coupler B is changed, and the refractive index change of the sensing optical fiber under the action of the magnetic field is measured by detecting and processing the interference optical intensity.

3 Claims, 7 Drawing Sheets

SYSTEM AND METHOD FOR MEASURING MAGNETOREFRACTIVE EFFECT OF OPTICAL FIBER

CROSS REFERENCE TO RELATED APPLICATION

This patent application claims the benefit and priority of Chinese Patent Application No. 202110635314.9, filed on Jun. 8, 2021, the disclosure of which is incorporated by reference herein in its entirety as part of the present application.

TECHNICAL FIELD

The present disclosure relates to the measurement field of magnetic fields, in particular to a system and a method for measuring a magnetorefractive effect of an optical fiber.

BACKGROUND ART

The magnetic field measurement technology is widely applied to the field of information industry, and is already applied to the fields of magnetic mine sweeping, ship demagnetization, weapon searching, submarine detection and the like. For example, in the field of submarine detection, the stealth technology is widely applied to modern submarines, so that the noise of the submarines is very low, the detection potential of sonar is weakened, and therefore a high requirement for the sensitivity of a magnetic field detector is provided. The high-sensitivity weak magnetic field measurement technology is always a research hot spot in many countries.

The interference type optical fiber magnetic field measurement system has the characteristics of being high in sensitivity, simple in structure, capable of being remotely controlled and capable of achieving distributed measurement, and occupies a very important position in the field of weak magnetic field measurement. At present, most interference type optical fiber magnetic field measurement systems on the market are based on the magnetostrictive effect of materials such as nickel alloy, ferrite and TbDyFe. The magnetostrictive material is deformed under the action of the external magnetic field, so that the optical path difference of the sensing optical fiber and the reference optical fiber is changed, and then the interference light intensity is changed. The interference light intensity is demodulated through a related phase demodulation algorithm, and the purpose of magnetic field measurement can be achieved. However, most interference type optical fiber magnetic field measurement systems based on the magnetostrictive effect have the following problems: firstly, the surface of the optical fiber must be coated with the magnetostrictive material, so that the complexity of the optical fiber sensing structure is increased, the operation difficulty is high, and a higher requirement is provided for a sensor manufacturing process; secondly, the principle of the magnetostrictive effect is very complex, the magnetostrictive material is deformed in the transverse direction and the longitudinal direction under the action of the magnetic field, the deformation quantity has a very complicated relationship with the size and direction of the magnetic field and the coating state of the material, so that the later phase demodulation and magnetic field calibration work is very difficult; and thirdly, after the magnetic field measurement system is built, the state of the magnetostrictive material changes along with time, the accuracy of magnetic field measurement is reduced, and the later maintenance cost of the system is very high.

SUMMARY

Aiming at the problems of complex sensing structure, difficult sensor manufacturing, high system maintenance cost and the like of a magnetic field measurement system based on a magnetostrictive effect, the present disclosure designs a magnetic field measurement system based on a magnetostrictive effect of an optical fiber for solving the defects. The magnetostrictive effect measurement of the optical fiber is the premise of researching the magnetic field measurement system based on a magnetostrictive effect of an optical fiber. The present disclosure provides a system and a method for measuring a magnetorefractive effect of an optical fiber. Through the magnetorefractive effect of the sensing optical fiber, a magnetic field signal is modulated into a refractive index signal of the sensing optical fiber, so that the optical path difference between two paths of optical signals of the sensing optical fiber and the reference optical fiber is changed, the interference optical signal intensity of the output end is changed, and the refractive index change of the sensing optical fiber under the action of the magnetic field is measured by detecting the interference optical intensity. The present disclosure lays a foundation for researching the magnetic field measurement system based on a magnetostrictive effect of an optical fiber.

In order to achieve the above purpose of the present disclosure, the present disclosure adopts the following inventive concepts:

The principle of the present disclosure is as follows.

When the external magnetic field acts on the sensing fiber, the permittivity tensor of the fiber changes as follows:

$$\varepsilon = \begin{pmatrix} n_l^2 & j\delta_l & 0 \\ -j\delta_l & n_l^2 & 0 \\ 0 & 0 & n_l^2 \end{pmatrix}$$

$n_l$ is the refractive index of the optical fiber without the action of the magnetic field, $\delta_l = Cf_{l\chi}B/\mu$ is the action factor of the magnetic field on the optical fiber, subscript l represents a fiber core or a cladding, and l is equal to 1, 2; C is the doping concentration of the magnetic sensitive material in the sensing optical fiber, $f_1$ and $\chi$ are the first-level magneto-optical coefficient and the magnetic susceptibility of the magnetic sensitive doped material respectively, $\mu$ is the magnetic conductivity, and B is the magnetic induction intensity. The dielectric constant tensors under different magnetic fields are substituted into the Maxwell equation to obtain different mode solutions, meaning that the mode effective refractive index of the sensing optical fiber changes along with the magnetic field. The specific change relation is related to the doping concentration of the magnetic sensitive material and the optical fiber structure parameters. The relationship between the refractive index $n_s$ of the sensing optical fiber and the magnetic induction intensity B can be expressed as follows:

$$n_s = f(B)$$

When the refractive index of the sensing optical fiber changes, the phase difference between two paths of optical signals transmitted in the sensing optical fiber and the reference optical fiber changes, and the relationship between the phase difference $\Delta\varphi$ and the magnetic induction intensity B is as follows:

$$\Delta\varphi = \frac{2\pi(n_s - n_r)L}{\lambda} = \frac{2\pi[f(B) - n_r]L}{\lambda}$$

L is the arm length of the interferometer, $\lambda$ is the wavelength of the optical wave, and $n_r$ is the refractive index of the reference fiber. The change of phase difference affects interference light intensity of two paths of optical signals of the sensing optical fiber and the reference optical fiber, and the interference light intensity is expressed as follows:

$$I = I_r + I_s + 2\sqrt{I_r I_s}\cos\Delta\varphi = A\left\{1 + V\cos\left[\frac{2\pi(f(B) - n_r)L}{\lambda}\right]\right\}$$

$I_s$ is the output light intensity of the sensing optical fiber, $I_r$ is the output light intensity of the reference optical fiber, A is equal to $I_r$ plus $I_s$, and V is the interference visibility. By detecting the interference light intensity, the refractive index change of the sensing optical fiber under the action of the magnetic field can be measured.

According to the inventive concepts, the present disclosure adopts the following technical scheme:

A system for measuring a magnetorefractive effect of an optical fiber comprises a laser, a coupler A, a sensing optical fiber, a reference optical fiber, a carrier generator, a coupler B, a photoelectric detector and a data acquisition and processing module;

an output port of the laser is connected with a first port of the coupler A, a second port of the coupler A is connected with a first port of the sensing optical fiber, and a third port of the coupler A is connected with a first port of the reference optical fiber; a second port of the sensing optical fiber is connected with a second port of the coupler B, and a second port of the reference optical fiber is connected with a third port of the coupler B; a first port of the coupler B is connected with an input port of the photoelectric detector; an input port of the data acquisition and processing module is connected with an output port of the photoelectric detector;

the sensing optical fiber is arranged in a magnetic field environment and used for modulating a magnetic field signal into a refractive index signal; and the carrier generator is formed by winding piezoelectric ceramic on the reference optical fiber, and the piezoelectric ceramic is connected with signal generators and used for generating phase carrier signals.

Preferably, an optical signal output by the laser is divided into two beams of light transmitted by the sensing optical fiber and the reference optical fiber through the coupler A, the two beams of light interfere with each other at the coupler B, the intensity of an interference optical signal is detected by the photoelectric detector, the interference optical signal is converted into an electric signal, and the electric signal is acquired and processed by the data acquisition and processing module.

Preferably, the coupler A, the sensing optical fiber, the reference optical fiber and the coupler B are connected to form a Mach-Zehnder optical fiber interferometer, the sensing optical fiber forms a sensing arm of the Mach-Zehnder optical fiber interferometer, the reference optical fiber forms a reference arm of the Mach-Zehnder optical fiber interferometer, the first port of the coupler A is an optical input port of the Mach-Zehnder optical fiber interferometer, and the first port of the coupler B is an optical output port of the Mach-Zehnder optical fiber interferometer.

Preferably, the system is based on the magnetorefractive effect of the sensing optical fiber, the refractive index of the sensing optical fiber is modulated by an external magnetic field, so that the optical path difference between two paths of optical signals in the sensing optical fiber and the reference optical fiber is changed, the intensity of the interference optical signal output by the coupler B is finally changed, and the refractive index change of the sensing optical fiber under the action of the magnetic field is measured by detecting the interference light intensity.

Preferably, the data acquisition and processing module comprises signal generators, frequency mixers, low-pass filters, differentiators, multipliers, a subtracter, an integrator and a band-pass filter; the signal generators are used for generating fundamental frequency carrier signals and frequency doubling carrier signals; the number of the frequency mixers, the number of the low-pass filters, the number of the differentiators and the number of the multipliers are respectively two; and the cut-off frequency of the low-pass filters is between the magnetic field signal frequency and the carrier frequency.

A method for measuring a magnetorefractive effect of an optical fiber comprises the following steps:

a, dividing the optical signal output by the laser into two beams of light transmitted by the sensing optical fiber and the reference optical fiber through the coupler A, wherein the two beams of light interfere with each other at the coupler B, and the intensity of the interference optical signal is detected by the photoelectric detector;

b, during direct-current magnetic field measurement, applying a direct-current magnetic field to the sensing optical fiber, wherein the magnetic field changes the refractive index of the sensing optical fiber, so that the optical path difference of optical signals in the sensing optical fiber and the reference optical fiber is changed, the output interference optical signal intensity of the coupler B is changed, the interference light intensity is converted into interference voltage by the photoelectric detector, and the refractive index change of the sensing optical fiber under the action of the direct-current magnetic field is measured by detecting the interference voltage; and during alternating-current magnetic field measurement, applying an alternating-current magnetic field to the sensing optical fiber, and applying a phase carrier signal to the reference optical fiber through the carrier generator, wherein the coupler B outputs the interference optical signal modulated by the alternating-current magnetic field, the interference optical signal is converted into an interference voltage signal by the photoelectric detector, the interference voltage signal is acquired to the data acquisition and processing module, and data processing is carried out on the interference voltage signal to restore phase change caused by the magnetorefractive effect of the sensing optical fiber; and c, aiming at direct-current magnetic field measurement, according to the interference voltage detected under each magnetic field, calculating the corresponding refractive index of the sensing optical fiber under the magnetic field through an interference formula, and realizing refractive index change measurement of the sensing optical fiber under the action of the direct-current magnetic field; and aiming at alternating-current magnetic field measurement, respectively mixing the interference voltage signal with the fundamental frequency carrier signals and the frequency doubling carrier signals to obtain two paths of mixing signals, filtering high-frequency signals in the two paths of mixing signals by the low-pass filters to obtain two paths of filtering signals, carrying out differential cross multiplication operation on the two paths of filtering signals to obtain a first path of signals and a second path of signals, and sequentially carrying out subtraction operation, integral operation and band-pass filtering on the first path of signals and the second path of signals to obtain phase change caused by the magnetorefractive effect of the optical fiber, and realizing the refractive index change measurement of the sensing optical fiber under the action of the alternating-current magnetic field by demodulating the phase.

The present disclosure has the following obvious outstanding substantive features and significant advantages compared with the prior art.

Firstly, the magnetorefractive effect of the optical fiber can be measured under the action of the direct-current magnetic field and the alternating-current magnetic field, and a foundation is laid for a magnetic field measurement system based on the magnetorefractive effect of the optical fiber.

Secondly, after the magnetorefractive effect of the optical fiber is measured, the magnetic field can be measured, and compared with a traditional electric magnetic field measurement system, the system is high in sensitivity, simple in structure, capable of being remotely controlled and capable of achieving distributed magnetic field measurement.

Thirdly, according to the magnetic field measurement system based on the magnetorefractive of the optical fiber, the surface of the optical fiber does not need to be coated with a magnetostrictive material, so that the problems of complex coating process, unstable state, high later maintenance cost and the like of the magnetostrictive material are avoided, and high-sensitivity measurement of the magnetic field can be realized without the aid of the magnetostrictive material.

DETAILED DESCRIPTION OF THE EMBODIMENTS

The scheme is further described below in combination with specific embodiments, and preferred embodiments are detailed below.

Embodiment I

Figure 1:
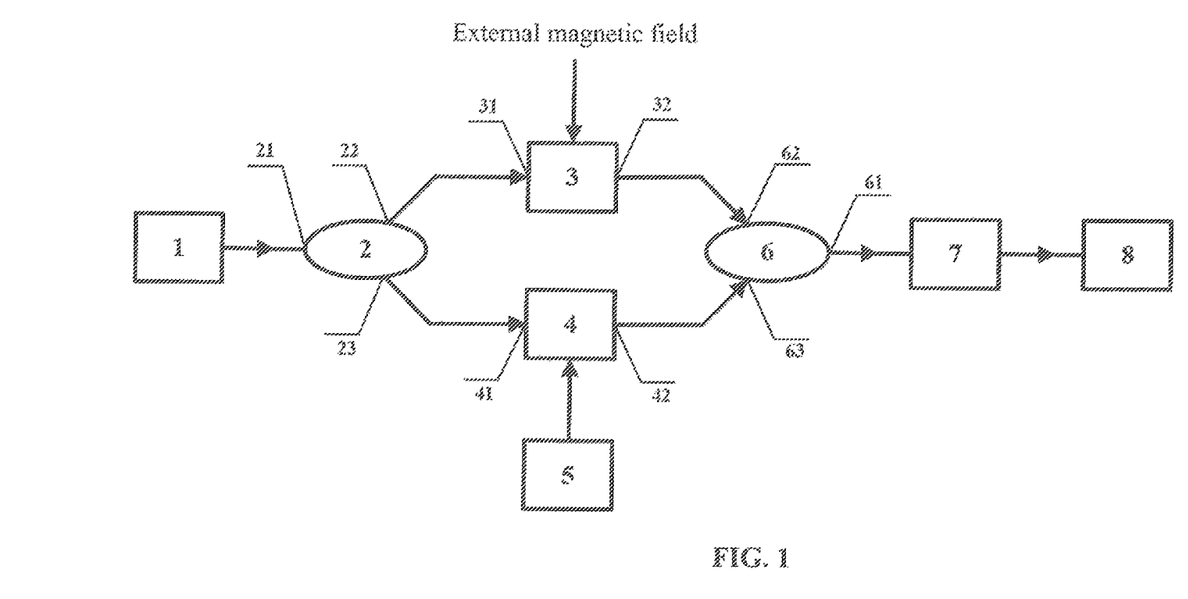
FIG. 1 is a structural schematic diagram of a system for measuring a magnetorefractive effect of an optical fiber in the present disclosure.

In the embodiment, referring to FIG. 1, a system for measuring a magnetorefractive effect of an optical fiber comprises a laser 1, a coupler A 2, a sensing optical fiber 3, a reference optical fiber 4, a carrier generator 5, a coupler B 6, a photoelectric detector 7 and a data acquisition and processing module 8;

an output port of the laser 1 is connected with a first port 21 of the coupler A 2, a second port 22 of the coupler A 2 is connected with a first port 31 of the sensing optical fiber 3, and a third port 23 of the coupler A 2 is connected with a first port 41 of the reference optical fiber 4; a second port 32 of the sensing optical fiber 3 is connected with a second port 62 of the coupler B 6, and a second port 42 of the reference optical fiber 4 is connected with a third port 63 of the coupler B 6; a first port 61 of the coupler B 6 is connected with an input port of the photoelectric detector 7; an input port of the data acquisition and processing module 8 is connected with an output port of the photoelectric detector 7;

the sensing optical fiber 3 is arranged in a magnetic field environment and used for modulating a magnetic field signal into a refractive index signal; and the carrier generator 5 is formed by winding piezoelectric ceramic on the reference optical fiber 4, and the piezoelectric ceramic is connected with signal generators and used for generating phase carrier signals.

In the embodiment, an optical signal output by the laser 1 is divided into two beams of light transmitted by the sensing optical fiber 3 and the reference optical fiber 4 through the coupler A 2, the two beams of light interfere with each other at the coupler B 6, the intensity of an interference optical signal is detected by the photoelectric detector 7, the interference optical signal is converted into an electric signal, and the electric signal is acquired and processed by the data acquisition and processing module 8.

According to the system for measuring a magnetorefractive effect of an optical fiber in the embodiment, the magnetic field signal can be modulated into a refractive index signal of the sensing optical fiber through the magnetorefractive effect of the sensing optical fiber, so that the optical path difference between two paths of optical signals in the sensing optical fiber and the reference optical fiber is changed, the interference optical signal intensity of the output end is changed, and the refractive index change of the sensing optical fiber under the action of the magnetic field is measured by detecting the interference light intensity.

Embodiment II

The embodiment is substantially the same as the first embodiment, but has the following exceptions.

Figure 2:
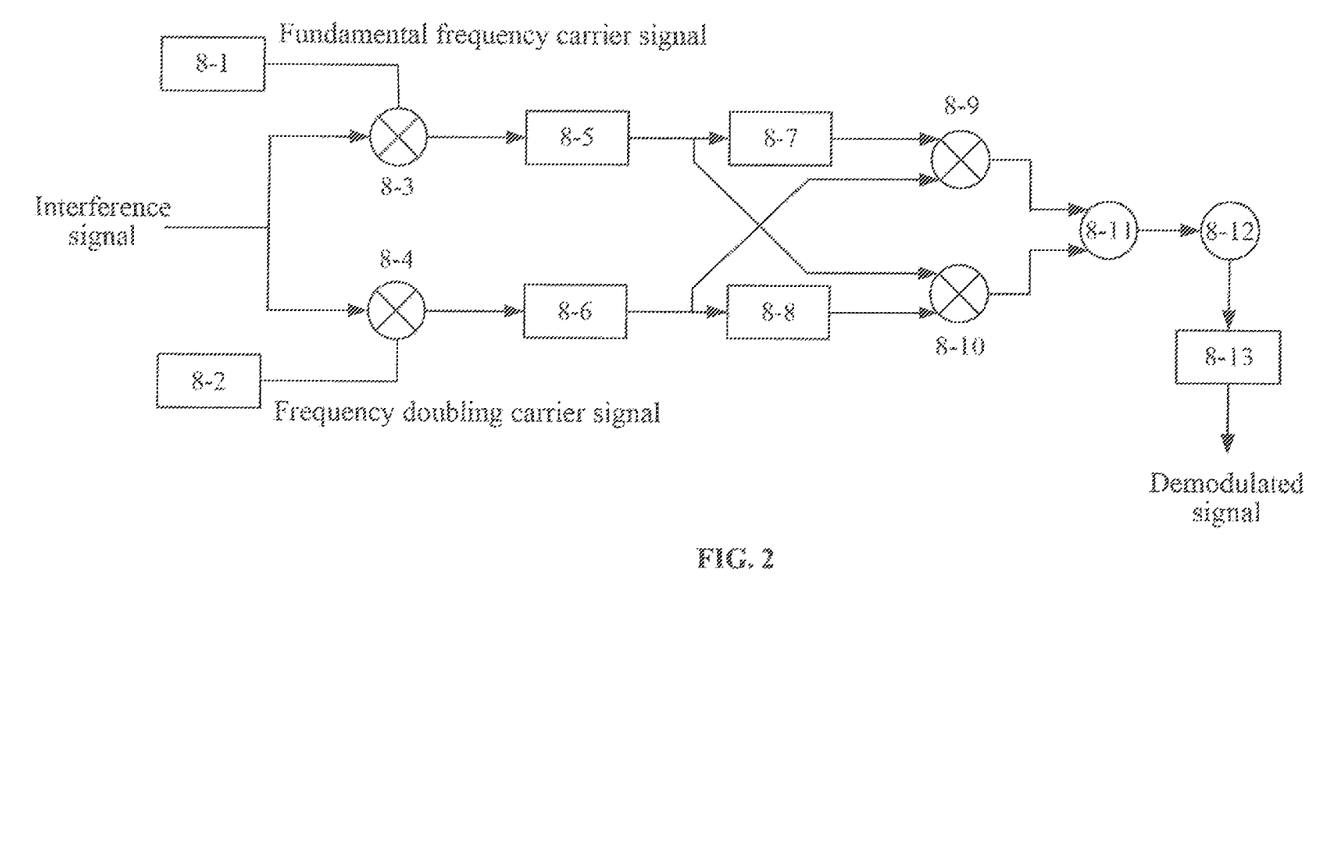
FIG. 2 is a structural schematic diagram of a data acquisition and processing module in the present disclosure.

In the embodiment, referring to FIG. 2, the coupler A 2, the sensing optical fiber 3, the reference optical fiber 4 and the coupler B 6 are connected to form a Mach-Zehnder optical fiber interferometer, the sensing optical fiber 3 forms a sensing arm of the Mach-Zehnder optical fiber interferometer, the reference optical fiber 4 forms a reference arm of the Mach-Zehnder optical fiber interferometer, the first port 21 of the coupler A 2 is an optical input port of the Mach-Zehnder optical fiber interferometer, and the first port 61 of the coupler B 6 is an optical output port of the Mach-Zehnder optical fiber interferometer.

In the embodiment, referring to FIG. 1, the system is based on the magnetorefractive effect of the sensing optical fiber 3, the refractive index of the sensing optical fiber 3 is modulated by an external magnetic field, so that the optical path difference between two paths of optical signals in the sensing optical fiber 3 and the reference optical fiber 4 is changed, the intensity of the interference optical signal output by the coupler B 6 is finally changed, and the refractive index change of the sensing optical fiber 3 under the action of the magnetic field is measured by detecting the interference light intensity.

In the embodiment, referring to FIG. 1 and FIG. 2, the data acquisition and processing module 8 comprises signal generators 8-1, 8-2, frequency mixers 8-3, 8-4, low-pass filters 8-5, 8-6, differentiators 8-7, 8-8, multipliers 8-9, 8-10, a subtracter 8-11, an integrator 8-12 and a band-pass filter 8-13; the signal generators 8-1, 8-2 are used for generating fundamental frequency carrier signals and frequency doubling carrier signals; the number of the frequency mixers 8-3, 8-4, the number of the low-pass filters 8-5, 8-6, the number of the differentiators 8-7, 8-8 and the number of the multipliers 8-9, 8-10 are respectively two; and the cut-off frequency of the low-pass filters 8-5, 8-6 is between the magnetic field signal frequency and the carrier frequency.

In the embodiment, the coupler A, the sensing optical fiber, the reference optical fiber and the coupler B of the system for measuring a magnetorefractive effect of an optical fiber form a Mach-Zehnder optical fiber interferometer. An external magnetic field influences the refractive index of the sensing optical fiber, so that the optical path difference between two paths of optical signals in the sensing optical fiber and the reference optical fiber is changed, the intensity of an interference optical signal output by the coupler B is changed, and the refractive index change of the sensing optical fiber under the action of the magnetic field is measured by detecting and processing the interference optical intensity. The system in the embodiment has the advantages of being high in sensitivity, simple in structure, capable of being remotely controlled and capable of achieving distributed measurement.

Embodiment III

The embodiment is substantially the same as the above embodiments, but has the following exceptions.

In the embodiment, referring to FIG. 1 and FIG. 2, a method for measuring a magnetorefractive effect of an optical fiber comprises the following steps:
  a, dividing the optical signal output by the laser 1 into two beams of light transmitted by the sensing optical fiber 3 and the reference optical fiber 4 through the coupler A 2, wherein the two beams of light interfere with each other at the coupler B 6, and the intensity of the interference optical signal is detected by the photoelectric detector 7;
  b, during direct-current magnetic field measurement, applying a direct-current magnetic field to the sensing optical fiber 3, wherein the magnetic field changes the refractive index of the sensing optical fiber 3, so that the optical path difference of optical signals in the sensing optical fiber 3 and the reference optical fiber 4 is changed, the output interference optical signal intensity of the coupler B 6 is changed, the interference light intensity is converted into interference voltage by the photoelectric detector, and the refractive index change of the sensing optical fiber 3 under the action of the direct-current magnetic field is measured by detecting the interference voltage; and during alternating-current magnetic field measurement, applying an alternating-current magnetic field to the sensing optical fiber 3, and applying a phase carrier signal to the reference optical fiber 4 through the carrier generator 5, wherein the coupler B 6 outputs the interference optical signal modulated by the alternating-current magnetic field, the interference optical signal is converted into an interference voltage signal by the photoelectric detector 7, the interference voltage signal is acquired to the data acquisition and processing module, and data processing is carried out on the interference voltage signal to restore phase change caused by the magnetorefractive effect of the sensing optical fiber 3; and
  c, aiming at direct-current magnetic field measurement, according to the interference voltage detected under each magnetic field, calculating the corresponding refractive index of the sensing optical fiber 3 under the magnetic field through an interference formula, and realizing refractive index change measurement of the sensing optical fiber 3 under the action of the direct-current magnetic field; and aiming at alternating-current magnetic field measurement, respectively mixing the interference voltage signal with the fundamental frequency carrier signals and the frequency doubling carrier signals to obtain two paths of mixing signals, filtering high-frequency signals in the two paths of mixing signals by the low-pass filters to obtain two paths of filtering signals, carrying out differential cross multiplication operation on the two paths of filtering signals to obtain a first path of signals and a second path of signals, and sequentially carrying out subtraction operation, integral operation and band-pass filtering on the first path of signals and the second path of signals to obtain phase change caused by the magnetorefractive effect of the optical fiber, and realizing the refractive index change measurement of the sensing optical fiber 3 under the action of the alternating-current magnetic field by demodulating the phase.

In the embodiment, the refractive index change of the optical fiber can be measured under the action of the direct-current magnetic field and the alternating-current magnetic field, and a foundation is laid for a magnetic field measurement system based on the magnetorefractive effect of the optical fiber; after the magnetorefractive effect of the optical fiber is measured in the embodiment, the magnetic field can be measured, and compared with a traditional electric magnetic field measurement system, the system is high in sensitivity, simple in structure, capable of being remotely controlled and capable of achieving distributed magnetic field measurement; and on the basis of the embodiment, according to the magnetic field measurement system based on the magnetorefractive of the optical fiber, the surface of the optical fiber does not need to be coated with a magnetostrictive material, so that the problems of complex coating process, unstable state, high later maintenance cost and the like of the magnetostrictive material are avoided, and high-sensitivity measurement of the magnetic field can be realized without the aid of the magnetostrictive material.

Embodiment IV

The embodiment is substantially the same as the above embodiments, but has the following exceptions.

In the embodiment, as shown in FIG. 1, an output port of the laser 1 is connected with a first port 21 of the coupler A 2, a second port 22 of the coupler A 2 is connected with a first port 31 of the sensing optical fiber 3, and a third port 23 of the coupler A 2 is connected with a first port 41 of the reference optical fiber 4; a second port 32 of the sensing optical fiber 3 is connected with a second port 62 of the coupler B 6, and a second port 42 of the reference optical fiber 4 is connected with a third port 63 of the coupler B 6; a first port 61 of the coupler B 6 is connected with an input port of the photoelectric detector 7; an input port of the data acquisition and processing module 8 is connected with an output port of the photoelectric detector 7; the sensing optical fiber 3 is arranged in a magnetic field environment and used for modulating a magnetic field signal into a refractive index signal; and the carrier generator 5 is formed by winding piezoelectric ceramic on the reference optical fiber, and the piezoelectric ceramic is connected with signal generators and used for generating phase carrier signals.

As shown in FIG. 2, the data acquisition and processing module 8 comprises signal generators 8-1, 8-2, frequency mixers 8-3, 8-4, low-pass filters 8-5, 8-6, differentiators 8-7, 8-8, multipliers 8-9, 8-10, a subtracter 8-11, an integrator 8-12 and a band-pass filter 8-13; the signal generators are used for generating fundamental frequency carrier signals and frequency doubling carrier signals; the number of the frequency mixers, the number of the low-pass filters, the number of the differentiators and the number of the multipliers are respectively two; and the cut-off frequency of the low-pass filters is between the magnetic field signal frequency and the carrier frequency.

In the embodiment, an optical signal output by the laser 1 is divided into two beams of light transmitted by the sensing optical fiber 3 and the reference optical fiber 4 through the coupler A 2, the two beams of light interfere with each other at the coupler B 6, the intensity of an interference optical signal is detected by the photoelectric detector 7, the interference optical signal is converted into an electric signal, and the electric signal is acquired and processed by the data acquisition and processing module 8. According to the system for measuring a magnetorefractive effect of an optical fiber in the embodiment, the magnetic field signal can be modulated into a refractive index signal of the sensing optical fiber through the magnetorefractive effect of the sensing optical fiber, so that the optical path difference of two paths of optical signals of the sensing optical fiber and the reference optical fiber is changed, the interference optical signal intensity of the output end is changed, and the refractive index change of the sensing optical fiber under the action of the magnetic field is measured by detecting the interference light intensity.

Embodiment V

The embodiment is substantially the same as the above embodiments, but has the following exceptions.

In the embodiment, the refractive index change of the sensing optical fiber under the action of the direct-current magnetic field is measured by adopting the system for measuring a magnetorefractive effect of an optical fiber in the fourth embodiment. The working wavelength of a selected laser is 1550 nm. The coupling ratio of the coupler A to the coupler B is 50:50. The selected sensing optical fiber is an erbium-doped optical fiber. The length of the sensing optical fiber is 31.638 cm. The selected reference optical fiber is a single-mode optical fiber. An oscilloscope is selected as the data acquisition module. Computer software is selected to realize the signal generators, the frequency mixers, the low-pass filters, the differentiators, the multipliers, the subtracter and the band-pass filter involved in the data processing module. A selected magnetic field generating device is composed of an adjustable current power supply and a solenoid.

Under the condition that a magnetic field is not applied, interference voltage of the photoelectric detector is output to the oscilloscope and displayed as a straight line by the oscilloscope. The straight line on the oscilloscope can be observed to be shifted up and down within a certain range and the voltage reading changes in real time by shifting the sensing optical fiber with the arm. The maximum value $U_{max}$ and the minimum value $U_{min}$ of the voltage are recorded. The measurement result of the $U_{max}$ is 3.92 V, and the measurement result of the $U_{min}$ is 0.88 V. The voltage reading on the oscilloscope fluctuates between 0.88 V and 3.92 V.

Figure 3:
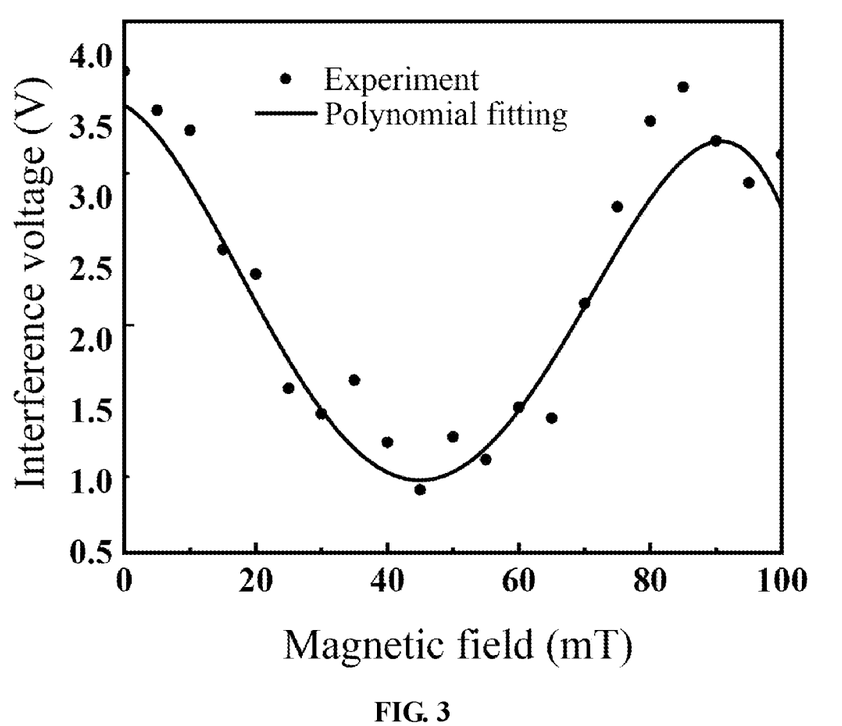
FIG. 3 is a corresponding relationship diagram of interference voltage and a magnetic field under the action of a direct-current magnetic field in the embodiment of the present disclosure.

The sensing optical fiber is arranged in the magnetic field generating device. The magnetic field generating device outputs different direct-current magnetic fields. The interference voltage $U_i$ is recorded under each magnetic field $B_i$. It is guaranteed that the refractive index of the sensing optical fiber has enough response time to the magnetic fields at intervals when the magnetic fields are switched. The corresponding relation between the finally obtained interference voltage and the magnetic field is as shown in FIG. 3. The refractive index ns of the sensing fiber at each magnetic field is calculated according to the following interference voltage formula:

$$U = \frac{U_{max} + U_{min}}{2} + \frac{U_{max} + U_{min}}{2} \cos\left[\frac{2\pi}{\lambda}(n_s - n_r)L\right]$$

Figure 4:
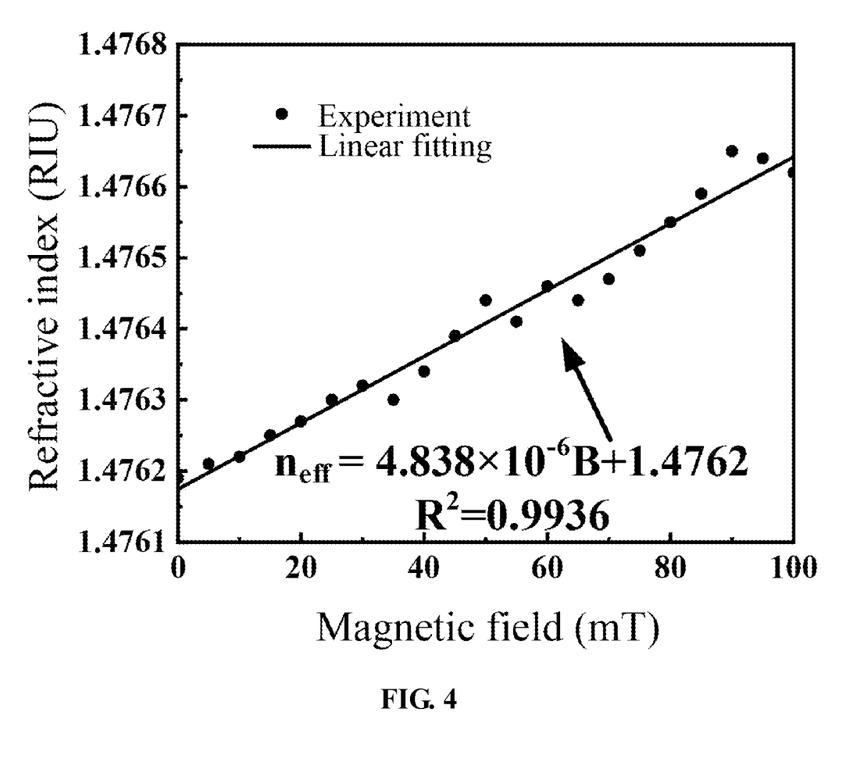
FIG. 4 is a corresponding relationship diagram of the refractive index of a sensing optical fiber and a magnetic field under the action of a direct-current magnetic field in the embodiment of the present disclosure.

Through calculation, the corresponding relation between the refractive index of the sensing optical fiber and the magnetic field is as shown in FIG. 4. According to the measurement result, under the action of the direct-current magnetic field, the sensitivity of the refractive index of the sensing optical fiber along with the change of the magnetic field is $4.838 \times 10^{-6}$ RIU/mT. After the magnetorefractive effect of the optical fiber is measured in the embodiment, the magnetic field can be measured. Compared with a traditional electric magnetic field measurement system, the system is high in sensitivity, simple in structure, capable of being remotely controlled and capable of achieving distributed magnetic field measurement; and high-sensitivity measurement of the magnetic field can be realized without the aid of the magnetostrictive material.

Embodiment VI

The embodiment is substantially the same as the above embodiments, but has the following exceptions.

In the embodiment, the magnetic field generating device outputs an alternating-current magnetic field to act on the sensing optical fiber so as to measure the refractive index change of the sensing optical fiber under the action of the alternating-current magnetic field.

Figure 5:
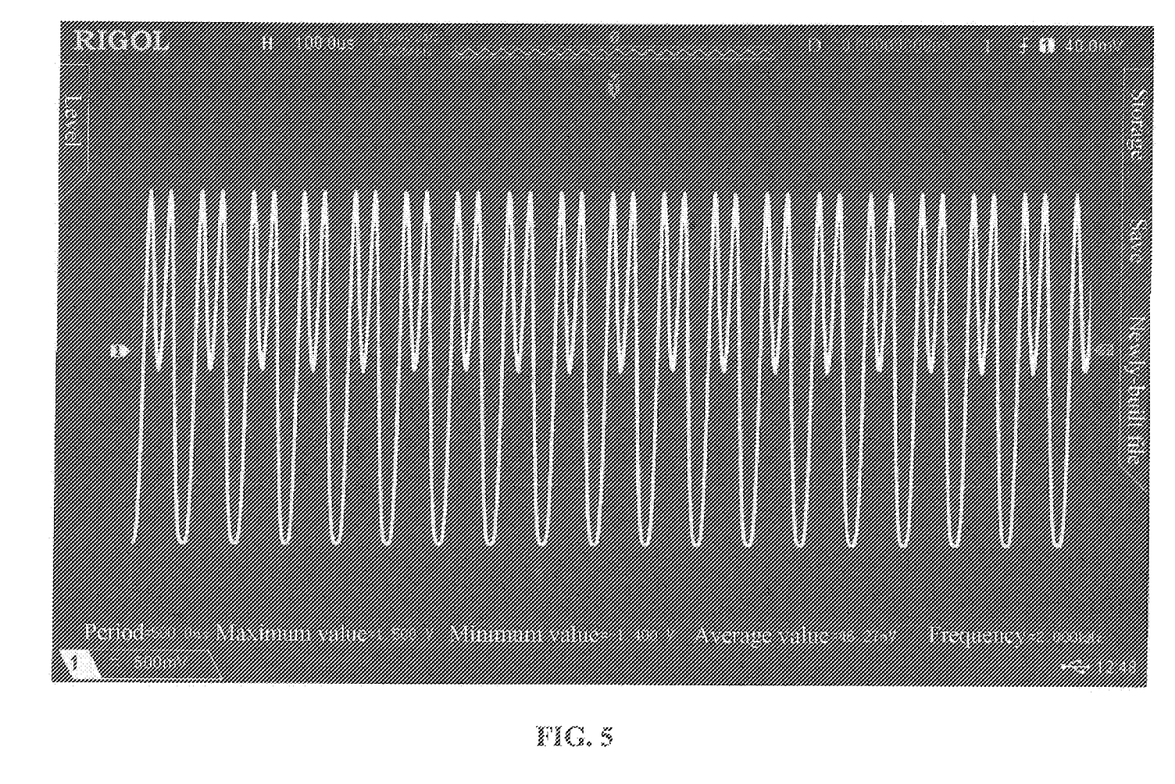
FIG. 5 is an interference oscillogram observed by an oscilloscope under the action of an alternating-current magnetic field in the embodiment of the present disclosure.

The sensing optical fiber is arranged in the magnetic field generating device. The magnetic field generating device outputs an alternating-current magnetic field, and the carrier generator is started to introduce phase carrier signals into the system. The waveform of interference signals can be observed through the oscilloscope as shown in FIG. 5. The interference signals are acquired to the data processing module for data processing. The interference light intensity signal output by system is as follows:

$$I(t)=A[1+V\cos(C\cos\omega_c t+\varphi_s(t))]$$

V is the interference visibility, C is the modulation depth, and $\cos\omega_c t$ is the phase carrier signal. The interference signals are respectively mixed with the fundamental frequency carrier signals and the frequency doubling carrier signals to obtain two paths of mixing signals, and the two paths of mixing signals obtain two paths of filtering signals $L_1(t)$ and $L_2(t)$ after respectively passing through the low-pass filters:

$$L_1(t)=-AVJ_1(C)\sin\varphi_s(t)$$

$$L_2(t)=-AVJ_2(C)\cos\varphi_s(t)$$

$L_1(t)$ and $L_2(t)$ are subjected to differential cross multiplication to obtain one path of signals $X_1(t)$ and two paths of signals $X_2(t)$:

$$X_1(t)=-(AV)^2J_1(C)J_2(C)\varphi_s(t)\sin^2\varphi_s(t)$$

$$X_2(t)=(AV)^2J_1(C)J_2(C)\varphi_s(t)\cos^2\varphi_s(t)$$

The demodulated signals can be obtained when $X_1(t)$ and $X_2(t)$ are subjected to subtraction, integration, and bandpass filtering:

$$S(t)=(AV)^2J_1(C)J_2(C)\varphi_s(t)$$

Figure 6:
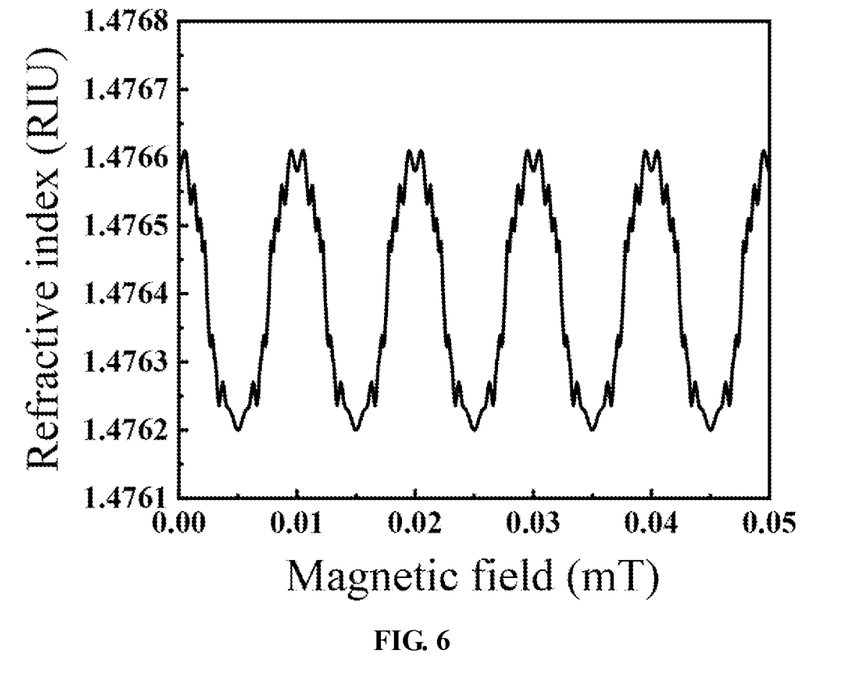
FIG. 6 is a demodulation oscillogram of the refractive index of a sensing optical fiber under the action of an alternating-current magnetic field in the embodiment of the present disclosure.
Figure 7:
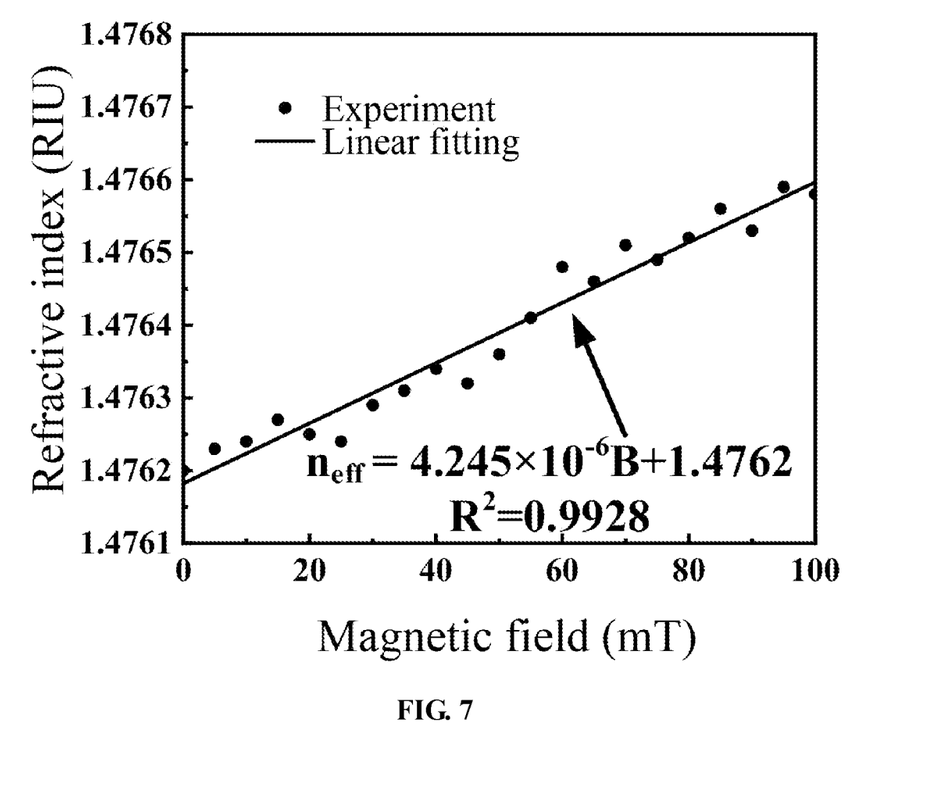
FIG. 7 is a corresponding relationship diagram of the refractive index of a sensing optical fiber and a magnetic field under the action of an alternating-current magnetic field in the embodiment of the present disclosure.

By demodulating the phase $\varphi_s(t)$, the waveform of the refractive index $n_s$ of the sensing fiber in the time domain can be calculated, as shown in FIG. 6. The magnetic field and refractive index data of a period are taken out, and the magnetic field and the refractive index are in one-to-one correspondence in the period, namely, the corresponding relation between the refractive index and the magnetic field of the sensing optical fiber under the action of the alternating-current magnetic field can be obtained, as shown in FIG. 7. According to the measurement result, under the action of the alternating-current magnetic field, the sensitivity of the refractive index of the sensing optical fiber along with the change of the magnetic field is $4.245\times10^{-6}$ RIU/mT. After the magnetorefractive effect of the optical fiber is measured in the embodiment, the magnetic field can be measured. Compared with a traditional electric magnetic field measurement system, the system is high in sensitivity, simple in structure, capable of being remotely controlled and capable of achieving distributed magnetic field measurement; and high-sensitivity measurement of the magnetic field can be realized without the aid of the magnetostrictive material.

In conclusion, the system for measuring a magnetorefractive effect of an optical fiber in the embodiment comprises a laser, a coupler A, a sensing optical fiber, a reference optical fiber, a carrier generator, a coupler B, a photoelectric detector and a data acquisition and processing module. The coupler A, the sensing optical fiber, the reference optical fiber and the coupler B form a Mach-Zehnder optical fiber interferometer. An external magnetic field influences the refractive index of the sensing optical fiber, so that the optical path difference between two paths of optical signals in the sensing optical fiber and the reference optical fiber is changed, the intensity of an interference optical signal output by the coupler B is changed, and the refractive index change of the sensing optical fiber under the action of the magnetic field is measured by detecting and processing the interference optical intensity. The system in the embodiment has the advantages of being high in sensitivity, simple in structure, capable of being remotely controlled and capable of achieving distributed measurement.

The embodiments of the present disclosure are described above in conjunction with the attached figures, but the present disclosure is not limited to the above embodiments, and can be changed in various ways according to the purpose of the creation of the present disclosure, and changes, modifications, substitutions, combinations or simplifications made according to the spirit and principle of the technical scheme of the present disclosure should be equivalent replacement ways, so that the technical scheme of the present disclosure can be improved. The present disclosure belongs to the protection scope of the present disclosure as long as the present disclosure object of the present disclosure is met and as long as the technical principle and the inventive concept of the present disclosure are not deviated.

What is claimed is:

1. A system for measuring a magnetorefractive effect of an optical fiber, comprising a laser (1), a coupler A (2), a sensing optical fiber (3), a reference optical fiber (4), a carrier generator (5), a coupler B (6), a photoelectric detector (7) and a data acquisition and processing module (8), wherein an output port of the laser (1) is connected with a first port (21) of the coupler A (2), a second port (22) of the coupler A (2) is connected with a first port (31) of the sensing optical fiber (3), and a third port (23) of the coupler A (2) is connected with a first port (41) of the reference optical fiber (4); a second port (32) of the sensing optical fiber (3) is connected with a second port (62) of the coupler B (6), and a second port (42) of the reference optical fiber (4) is connected with a third port (63) of the coupler B (6); a first port (61) of the coupler B (6) is connected with an input port of the photoelectric detector (7); an input port of the data acquisition and processing module (8) is connected with an output port of the photoelectric detector (7), the optical signal output by the laser (1) being divided into two beams of light transmitted by the sensing optical fiber (3) and the reference optical fiber (4) through the coupler A (2), the two beams of light interfering with each other at the coupler B (6), and the intensity of the interference optical signal being detected by the photoelectric detector (7);

the sensing optical fiber (3) is arranged in a magnetic field environment and used for modulating a magnetic field signal into a refractive index signal; and the carrier generator (5) is formed by winding piezoelectric ceramic on the reference optical fiber (4), and the piezoelectric ceramic is connected with signal generators and used for generating phase carrier signals;

during direct-current magnetic field measurement, a direct-current magnetic field is applied to the sensing optical fiber (3), wherein the magnetic field changes the refractive index of the sensing optical fiber (3), so that the optical path difference of optical signals in the sensing optical fiber (3) and the reference optical fiber (4) is changed, the output interference optical signal intensity of the coupler B (6) is changed, the interference light intensity is converted into interference voltage by the photoelectric detector, and the refractive index change of the sensing optical fiber (3) under the action of the direct-current magnetic field is measured by detecting the interference voltage; and during alternating-current magnetic field measurement, an alternating-current magnetic field is applied to the sensing optical fiber (3), and a phase carrier signal is applied to the reference optical fiber (4) through the carrier generator (5), wherein the coupler B (6) outputs the interference optical signal modulated by the alternating-current magnetic field, the interference optical signal is converted into an interference voltage signal by the photoelectric detector (7), the interference voltage signal is acquired to the data acquisition and processing module, and data processing is carried out on the interference voltage signal to restore phase change caused by the magnetorefractive effect of the sensing optical fiber (3); and aiming at direct-current magnetic field measurement, according to the interference voltage detected under each magnetic field, the corresponding refractive index of the sensing optical fiber (3) under the magnetic field is calculated through an interference formula, and the refractive index change measurement of the sensing optical fiber (3) under the action of the direct-current magnetic field is realized; and aiming at alternating-current magnetic field measurement, the interference voltage signal and the fundamental frequency carrier signals and the frequency doubling carrier signals are respectively mixed to obtain two paths of mixing signals, the high-frequency signals in the two paths of mixing signals are filtered by the low-pass filters to obtain two paths of filtering signals, differential cross multiplication operation on the two paths of filtering signals are carried out to obtain a first path of signals and a second path of signals, and a subtraction operation, integral operation and band-pass filtering are sequentially carried out on the first path of signals and the second path of signals to obtain phase change caused by the magnetorefractive effect of the optical fiber, and the refractive index change measurement of the sensing optical fiber (3) under the action of the alternating-current magnetic field by demodulating the phase is realized.

2. The system for measuring a magnetorefractive effect of an optical fiber according to claim 1, wherein the coupler A (2), the sensing optical fiber (3), the reference optical fiber (4) and the coupler B (6) are connected to form a Mach-Zehnder optical fiber interferometer, the sensing optical fiber (3) forms a sensing arm of the Mach-Zehnder optical fiber interferometer, the reference optical fiber (4) forms a reference arm of the Mach-Zehnder optical fiber interferometer, the first port (21) of the coupler A (2) is an optical input port of the Mach-Zehnder optical fiber interferometer, and the first port (61) of the coupler B (6) is an optical output port of the Mach-Zehnder optical fiber interferometer.

3. The system for measuring a magnetorefractive effect of an optical fiber according to claim 1, wherein the data acquisition and processing module (8) comprises signal generators (8-1, 8-2), frequency mixers (8-3, 8-4), low-pass filters (8-5, 8-6), differentiators (8-7, 8-8), multipliers (8-9, 8-10), a subtracter (8-11), an integrator (8-12) and a band-pass filter (8-13); the signal generators (8-1, 8-2) are used for generating fundamental frequency carrier signals and frequency doubling carrier signals; the number of the frequency mixers (8-3, 8-4), the number of the low-pass filters (8-5, 8-6), the number of the differentiators (8-7, 8-8) and the number of the multipliers (8-9, 8-10) are respectively two; and the cut-off frequency of the low-pass filters (8-5, 8-6) is between the magnetic field signal frequency and the carrier frequency.

* * * * *